(12) United States Patent
Jindal

(10) Patent No.: US 8,522,089 B2
(45) Date of Patent: Aug. 27, 2013

(54) METHOD OF TESTING ASYNCHRONOUS MODULES IN SEMICONDUCTOR DEVICE

(75) Inventor: Deepak Jindal, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 278 days.

(21) Appl. No.: 13/010,790

(22) Filed: Jan. 21, 2011

(65) Prior Publication Data

US 2012/0192021 A1 Jul. 26, 2012

(51) Int. Cl.
*G06F 11/00* (2006.01)
*G11C 29/56* (2006.01)

(52) U.S. Cl.
CPC ................................. *G11C 29/56* (2013.01)
USPC .................................................... 714/718

(58) Field of Classification Search
USPC ........................................................ 714/718
See application file for complete search history.

(56) References Cited

U.S. PATENT DOCUMENTS

| | | | |
|---|---|---|---|
| 4,864,496 A * | 9/1989 | Triolo et al. | 710/306 |
| 5,313,594 A * | 5/1994 | Wakerly | 710/105 |
| 5,412,663 A | 5/1995 | Kromer et al. | |
| 5,444,858 A * | 8/1995 | Wakerly | 713/600 |
| 6,880,117 B2 * | 4/2005 | Lin et al. | 714/718 |
| 7,155,651 B2 * | 12/2006 | Nadeau-Dostie et al. | 714/731 |
| 7,373,560 B1 * | 5/2008 | Kingsley et al. | 714/700 |
| 2003/0117881 A1 * | 6/2003 | Johnson et al. | 365/233 |
| 2004/0042312 A1 * | 3/2004 | Kim et al. | 365/222 |
| 2005/0041450 A1 * | 2/2005 | Duh et al. | 365/1 |
| 2008/0086663 A1 * | 4/2008 | Park et al. | 714/718 |
| 2010/0011264 A1 * | 1/2010 | Pugliesi-Conti et al. | 714/731 |

* cited by examiner

*Primary Examiner* — Cynthia Britt
*Assistant Examiner* — Colin Baird
(74) *Attorney, Agent, or Firm* — Charles Bergere

(57) ABSTRACT

A method of testing a semiconductor device that includes first and second mutually asynchronous modules, a buffer for storing transaction data for read/write operations from the first module and transferring it to the second module synchronously with the data rate of the second module, and an inhibit input. The second module receives the transaction data from the buffer and transfers the data to a data output when the inhibit signal is de-asserted and not when the inhibit signal is asserted. The method of testing includes repeatedly: asserting the inhibit signal; providing test transaction data to the first module and storing the data in the buffer while the inhibit signal is asserted; de-asserting the inhibit signal so that the second module transfers test transaction data received from the buffer to the data output synchronously with the data rate of the second module; and capturing deterministically test transaction data from the output of the second module.

20 Claims, 7 Drawing Sheets

METHOD OF TESTING ASYNCHRONOUS MODULES IN SEMICONDUCTOR DEVICE

BACKGROUND OF THE INVENTION

The present invention is directed to a method of testing a semiconductor device including asynchronous modules, and to a semiconductor device including asynchronous modules.

Different modules in a semiconductor device may be sufficiently asynchronous that the response of the device to test signals is indeterministic, that is to say that the timing of the responses of the asynchronous modules of similar devices produced in different production batches, or of a given device operating at different supply voltages or at different temperatures may differ by one or more clock cycles unpredictably. Semiconductor devices often include more than one clock domain at different frequencies. The different clock domains may have asynchronous clock signal generators, causing the different modules to be asynchronous, for example.

A semiconductor device may also include both a single data rate ('SDR') module and a double data rate ('DDR') module. An SDR module performs one data transfer per full cycle (rise and fall) of a clock signal, which requires that the clock signal change twice per data transfer. A DDR module transfers data on both the rising and falling edges of the clock signal and, by using both edges of the clock signal, for a given clock frequency a DDR module operates at double the data transfer rate of an SDR module.

Automatic test equipment ('ATE') is widely used to test semiconductor devices. When used to test a semiconductor device including asynchronous modules, there is a risk of indeterministic response of the device under test ('DUT') if the test operation is carried out at the full clock frequencies and data rates of the DUT, leading to faulty test results and reduced yield in production. If the operation of the modules can be made synchronous during the test, by running the DUT at a single clock frequency for example, the risk of indeterministic response of the DUT may be eliminated. However, the test conditions may no longer be representative of the normal operational data transfer rates of the DUT and the test may not reveal defects, or may signal defects erroneously, because of frequency-dependent parasitic effects and because the modules are operating under test at a different clock frequency from their normal operational clock frequencies, for example.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Similar elements in the different figures bear similar reference numbers.

DETAILED DESCRIPTION OF PREFERRED EMBODIMENTS OF THE INVENTION

Figure 1:
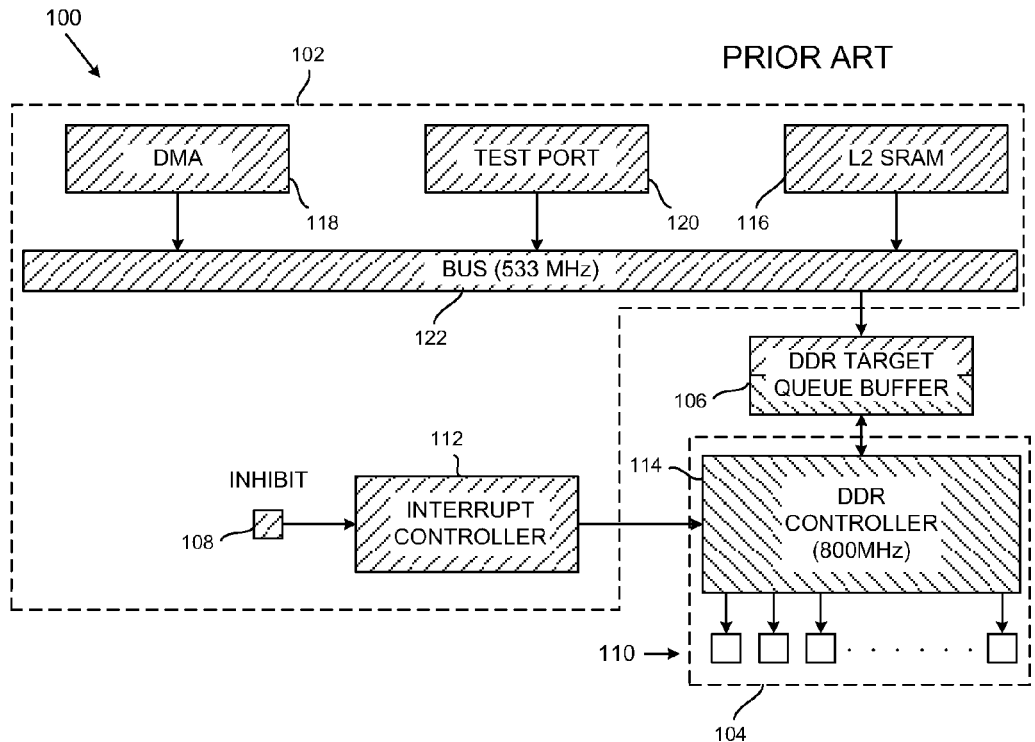
FIG. 1 is a block schematic diagram of a conventional semiconductor device including asynchronous modules.

FIG. 1 shows a conventional semiconductor device 100 that has a first module 102 and a second module 104 which are mutually asynchronous. The semiconductor device 100 includes a target queue buffer ('TQB') 106 for transferring transaction data in use of the device from the first module 102 to the second module 104 synchronously with an operational data transfer rate of the second module 104, and also includes an inhibit input 108 for receiving an inhibit signal. The second module 104 includes a data output 110 and is operative in use of the device to receive the transaction data for read/write operations from the target queue buffer 106 and to transfer the data received to the data output 110 when the inhibit signal is de-asserted. The second module 104 prevents transfer of the transaction data from the target queue buffer 106 to the second module 104, by blocking acknowledgement signals, and prevents transfer of transaction data to the data output 110 when the inhibit signal is asserted. In an example of the known semiconductor device, the device may be powered by a battery (not shown). The inhibit signal is an external 'panic interrupt' signal provided when the battery voltage becomes undesirably low and is applied through an interrupt controller 112 to a DDR controller 114 in the second module 104 to cause the second module to halt sending acknowledgement signals to, and receiving data from, the target queue buffer 106 and to enter self-refresh mode.

In the conventional semiconductor device 100, the first module 102 is a SDR module, shown as operating on a data rate of 533 MHz, in a first clock domain CLK1 and the second module 104 is a DDR module, shown as operating on a data rate of 800 MHz, in a second clock domain CLK2, different from the clock domain CLK1 of the first module 102. Clock signals 202 and 204 (see FIG. 2) for the clock domains CLK1 and CLK2 respectively are generated by separate clock generators (not shown), using separate phase-locked loops ('PLLs') for example, so that the resulting data from the clock domains CLK1 and CLK2 are asynchronous. The first module 102 includes a memory element 116, in this case a static random access, level 2 memory, a direct memory access element 118, a test port 120 operating in the first clock domain, and a data bus 122 operating at the data rate of the first module 102, 533 MHz and supplying data from the elements 116, 118 and 120 to the target queue buffer 106.

Figure 2:
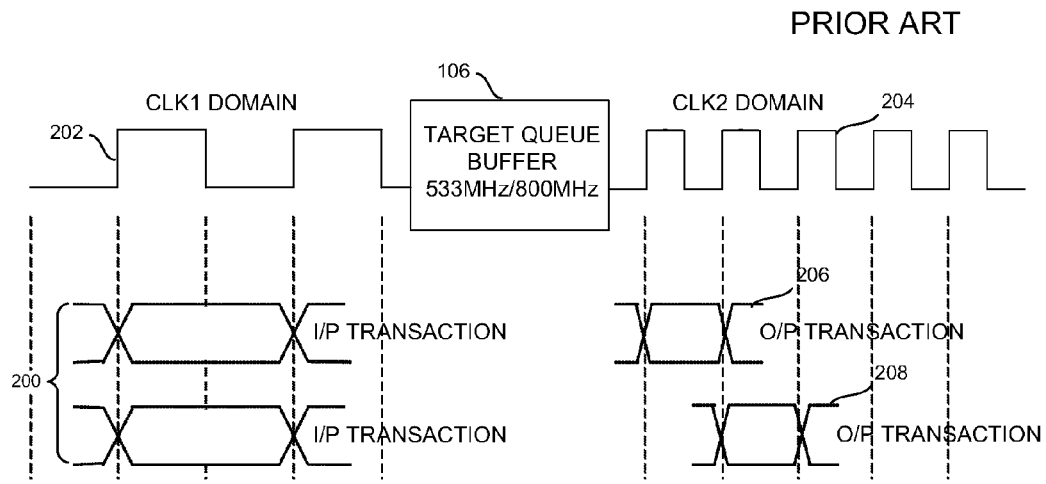
FIG. 2 is a graph of signals appearing during testing of the semiconductor device of FIG. 1 asynchronously.

FIG. 2 illustrates the consequences of testing the semiconductor device 100 using simple ATE, without any precautions to synchronize transactions between the two clock domains when patterns of test signals are applied to the test port 120 of the DUT. The test pattern signals are shown schematically at

200, as applied and written in to the target queue buffer 106, synchronously with clock signals 202 of the clock domain CLK1 of the first module 102. The content of the target queue buffer 106 is read out under a read control generated in the clock domain CLK1 but then synchronized relative to the clock domain CLK2, so that the content of the target queue buffer 106 has been able to stabilize. Since the clock signals 204 of the clock domain CLK2 are at a different frequency and phase from the clock signals 202 of the clock domain CLK1, the test transaction data may appear in the clock domain CLK2 of the second module 104 one or more clock cycles earlier, as shown at 206, or later, as shown at 208, for similar parts of different production batches or, for a given part, at different operating temperatures or supply voltages, or in case of metastability occurring. Such a random (or at least unpredictable) shift of timing of the test outputs can lead to indeterministic and faulty test results.

Figure 3:
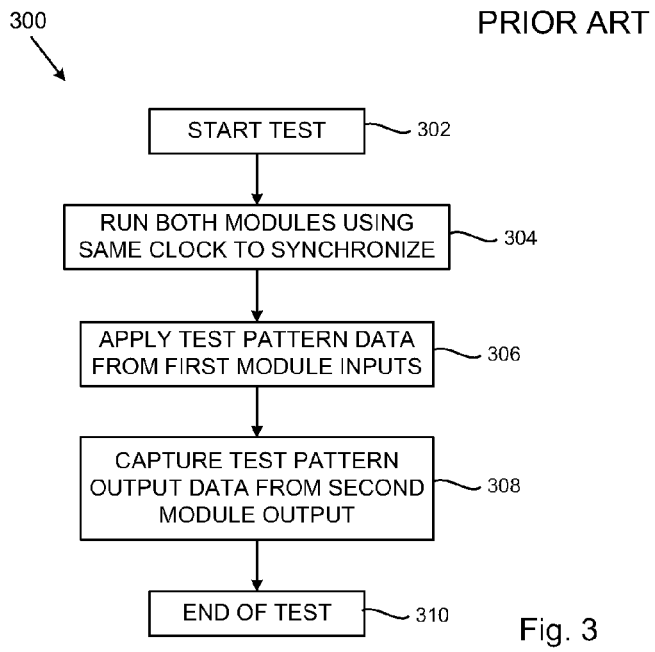
FIG. 3 is a simplified flow chart of a known method of testing the semiconductor device of FIG. 1 synchronously.

FIG. 3 illustrates a known method 300 of eliminating this cause of indeterministic response of the DUT 100. The method 300 starts at 302. At 304, the ATE actuates a multiplexer (not shown) to apply the same clock signal from the same clock generator, in this example the clock signals 202 of the clock domain CLK1, to both the first module 102 and the second module 104, so that the data rates are in synchronism. At 306, a pattern of test transaction signals are applied by the ATE to the inputs of the first module 102. The controller transfers the test transaction data from the buffer 106 to the data output 110 synchronously with the altered data transfer rate of the second module 104. At 308, test transaction data is captured from the output of the second module 104. The test method ends at 310.

The test method 300 achieves deterministic test transaction data within the second module 104. However, the clock signals within the second module 104 are not the same as the operational clock domain CLK2, so that the test conditions are no longer representative of the normal operational data transfer rates of the DUT 100. The test may not reveal defects, or may signal defects erroneously, because of frequency-dependent parasitic effects and because the module 102 or 104 is operating under test at a different clock frequency from its normal operational clock frequency and data rate, for example.

Figure 4:
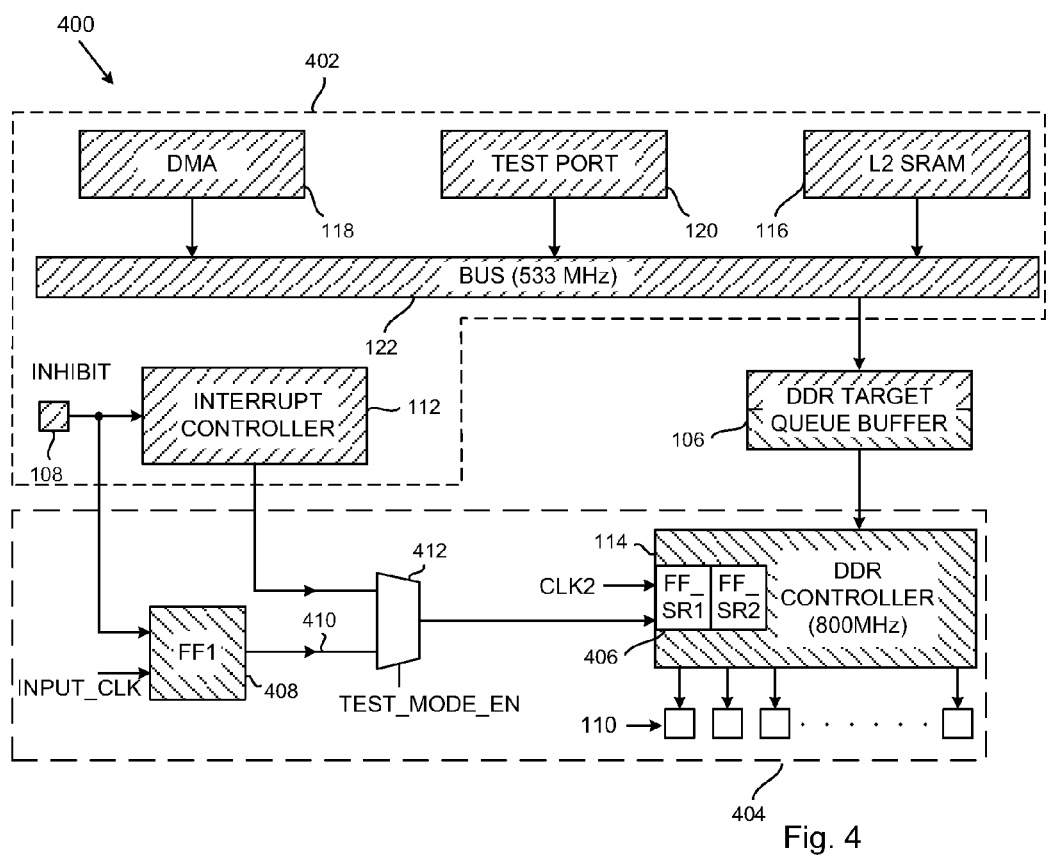
FIG. 4 is a block schematic diagram of a semiconductor device including asynchronous modules in accordance with one embodiment of the invention, given by way of example.

FIG. 4 shows a semiconductor device 400 in accordance with one embodiment of the invention, given by way of example. The device 400 includes a first module 402 and a second module 404 included respectively in a first clock domain CLK1 and in a second clock domain CLK2 which are mutually asynchronous. Like the semiconductor device 100, the semiconductor device 400 includes a target queue buffer ('TQB') 106 for storing transaction data for read/write operations from the first module 402 and transferring the stored transaction data to the second module 404 synchronously with an operational data transfer rate of the second module 404, and also includes an inhibit input 108 for receiving an inhibit signal. The second module 404 includes a transaction data output 110.

In the example of semiconductor device 400 shown in FIG. 4, the second module 404 is operative both in normal use of the device and during test of the device to receive the transaction data from the target queue buffer 106 and to transfer the received transaction data to the transaction data output 110 when the inhibit signal is de-asserted. The second module 104 does not receive transaction data from the target queue buffer 106 nor transfer transaction data to the transaction data output 110 when the inhibit signal is asserted. The second module 104 prevents transfer of transaction data by the buffer 106, for example by blocking acknowledgement signals, when the inhibit signal is asserted. The second module 404 also includes synchronization elements 406, 408 operable at least during test of the device for synchronizing with the second clock domain de-assertion of the inhibit signal at the second module 404.

In the example of semiconductor device 400 shown in FIG. 4, the first module 402 is a single data rate ('SDR') module, operating in the first clock domain CLK1 at a data rate of 533 MHz, and the second module 404 is a double data rate ('DDR') module, operating at a data rate of 800 MHz, in the second clock domain CLK2. However, embodiments of the invention are applicable to other systems working on asynchronous clocks with a buffer for transferring transaction data in use of the device from said first module to said second module synchronously between the two clock domains The first module 402 includes a memory element 116, in this case a static random access, level 2 memory, a direct memory access element 118, a test port 120 operating in the first clock domain, and a data bus 122 operating at the data rate of the first module 402, 533 MHz and supplying data from the elements 116, 118 and 120 to the target queue buffer 106.

In this example of the semiconductor device 400, in normal operation assertion of the inhibit signal from the inhibit input 108 in the first clock domain CLK1 is applied through an interrupt controller 112 to a DDR controller 114 in the second module 404 through a synchronization element 406 in the second clock domain CLK2 which synchronizes the inhibit signal from the interrupt controller (CLK1 domain) in normal functional mode. Assertion of the inhibit signal causes the second module to halt receiving data from, and sending acknowledgement signals to, the target queue buffer 106. The second module 404 then enters self-refresh mode. In normal use of the semiconductor device 400, the device may be powered by a battery (not shown) and the inhibit signal is an external 'panic interrupt' signal provided when the battery voltage becomes undesirably low.

During test of the semiconductor device 400, however, de-assertion of the inhibit signal at the double data rate ('DDR') controller 114 directly through the synchronization element 406 might cause indeterministic behavior since the synchronization element 406 might recognize the de-assertion one cycle early or late. For example, the DDR controller 404 might resume acknowledgement signals and exit self-refresh mode early or late, shifting output data.

Accordingly, in this example of an embodiment of the invention, to avoid the risk that such indeterministic behavior cause errors during testing, the synchronization logic for synchronizing the inhibit signal in the second module 404 also comprises a flip-flop element 408 having a first input connected to sample an inhibit signal that programmed automatic test equipment ('ATE') (not shown) applies to the inhibit input 108 and synchronize it to an input clock signal INPUT_CLK on a second input of the flip-flop element 408 before the inhibit signal reaches the synchronizer element 406. The input clock signal INPUT_CLK is coherent with the second clock domain CLK2, that is to say that its frequency and phase have a defined relationship with the second clock domain CLK2. In this example, the clock signal INPUT_CLK is a signal applied as clock input to the clock signal generator of the second clock domain CLK2 and has a lower frequency than the clock signal of the second clock domain CLK2. In another example of an embodiment of the invention, the clock input of the flip-flop element 408 is a low frequency clock generated by dividing CLK2 by a factor such as 2, 4, 8 or 16. The clock frequency is of sufficiently lower frequency than the clock signal of the second clock domain CLK2 to allow the ATE a sufficient timing window to drive the inhibit signal from system on chip ('SoC') pads while being deterministically sampled in the same clock cycle by the flip-flop element 408 in spite of process, temperature and voltage variations. The flip-flop element 408 is operative during test of the device for synchronizing assertion and de-assertion of the inhibit signal at the second module with the second clock domain CLK2 before the inhibit signal is applied to the DDR controller 114 of the second module 404.

The flip-flop element 408 drives a synchronized inhibit signal on a line 410 when the first active edge of the clock signal INPUT_CLK occurs after the inhibit signal from the inhibit input 108 is asserted or de-asserted. A multiplexer 412 controlled by the test mode signal TEST_MODE_EN provided by the ATE. is connected to select the synchronized inhibit signal from the line 410 if the test mode signal TEST_MODE_EN is asserted, to ensure deterministic behavior of the DDR controller 114 during test. The multiplexer 412 selects the unsynchronized inhibit signal from the interrupt controller 112 during normal operation when the test mode signal TEST_MODE_EN is de-asserted.

The synchronization element 406, which comprises a pair of cascaded bistable elements, has a first, data input connected to the output of the multiplexer 412 and a second, clock input connected to receive the clock signal from the second clock domain CLK2. In normal operation, the test mode signal TEST_MODE_EN is de-asserted and the synchronization element 406 ensures the asynchronous inhibit signal from interrupt controller (synchronous to CLK1 domain) is synchronized to CLK2 domain before DDR controller 114 uses it. During test operation, the test mode signal TEST_MODE_EN is asserted and the flip-flop element 408 ensures that the inhibit signal on line 410 is already synchronized to CLK2 domain before it reaches double flip-flop synchronization element 406 inside DDR controller 114 after selection by the multiplexer 412. In the test mode, the double flip-flop synchronization element 406 operates as normal back-to-back flip-flops working on CLK2 domain clock but operates as cascaded synchronizer first and second flip-flops during normal operation, to prevent metastability propagation in the design.

In this example of an embodiment of the invention, assertion of the inhibit signal inhibits transfer of the transaction data by the second module 404 to the transaction data output 110 and causes the second module 404 to function in a self-refresh mode. The second module 404 issues acknowledgements of the transaction data to the buffer 106 when the inhibit signal is de-asserted but not when the inhibit signal is asserted. The buffer 106 stores transaction data from the first module 402 and transfers the stored transaction data to the second module 404 in response to the acknowledgements but continues to store the transaction data from the first module 402 when acknowledgements are not received. The number of transactions stored in the buffer 106 depends on the capacity of buffer 106. When the inhibit signal is de-asserted, the second module 404 starts issuing acknowledgements to 106 again and the transaction data stored in the buffer 106 are issued to the second module 404 one after another synchronously with the CLK2 domain.

Figure 5:
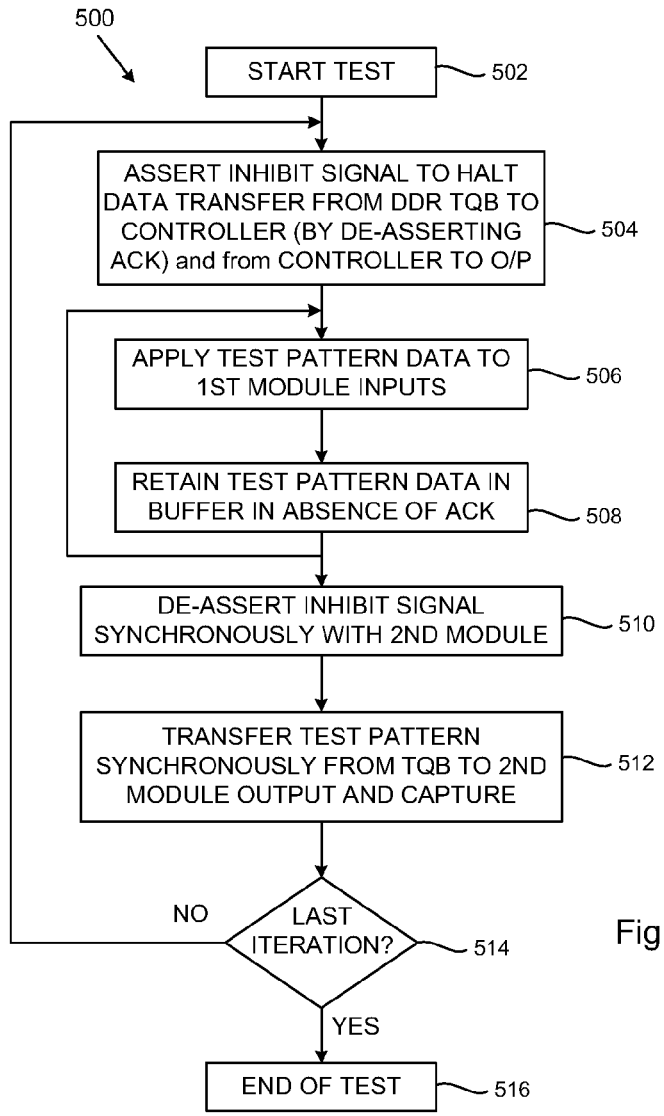
FIG. 5 is a simplified flow chart of a method of testing the semiconductor device of FIG. 4 synchronously in accordance with one embodiment of the invention, given by way of example.

FIG. 5 shows a method 500 of testing a semiconductor device, in accordance with one embodiment of the invention, given by way of example. The method 500 is applicable to testing a semiconductor device, such as the device 400 of FIG. 4, which includes a first module 402 and a second module 404 which are mutually asynchronous, a buffer 106 for storing transaction data for read/write operations from the first module 402 and transferring the stored transaction data to the second module 404 synchronously with an operational data transfer rate of the second module, and an inhibit input 108 for receiving an inhibit signal, the second module including a transaction data output 110 and being operative both in normal use of the device and during test of the device to receive the transaction data from the buffer 106 and to transfer the received transaction data to the transaction data output 110 when the inhibit signal is de-asserted and not to receive transaction data nor transfer transaction data to the transaction data output when the inhibit signal is asserted.

After starting at 502, the method 500 comprises repeatedly performing the following steps. At 504, the inhibit signal from ATE is asserted so as to inhibit transfer of transaction data to the transaction data output 110. At 506, test transaction data from the ATE is provided to the first module 402 and, at 508, stored in the buffer 106 while the inhibit signal is asserted. The steps 506 and 508 may be repeated up to the limit set by the capacity of the buffer 106. At 510, the inhibit signal is de-asserted synchronously with the CLK2 domain, so that the DDR controller 114 transfers test transaction data received from the buffer 106 to the transaction data output 110 synchronously with the operational data transfer rate of the second module 404. At 512, test transaction data is captured deterministically from the transaction data output of the second module 404 on the ATE. At 514, if further test iterations are needed, the process returns to step 504. If the last test iteration has been performed, the test method ends at 516.

In this example of an embodiment of the invention, the second module 404 issues acknowledgements of transaction control signals and data to the buffer 106 when the inhibit signal is de-asserted 510 but not when the inhibit signal is asserted 504. The buffer 106 stores transaction control signals and data from the first module 402 but transfers the stored transaction control signals and data to the second module 404 only in response to the acknowledgements. At 510, the inhibit signal is de-asserted, synchronously to the clock domain CLK2 of the second module 404 after a delay sufficient to ensure that the transaction data is stable in the target queue buffer 106 and can be read out deterministically by the logic circuits in the buffer working on the second clock domain CLK2.

In this example of a method 500 in accordance with an embodiment of the invention, assertion 504 of the inhibit signal may inhibit transfer of the transaction data by the second module to the transaction data output port 110. Assertion 504 of the inhibit signal may cause the second module to function in a self-refresh mode. The first module 402 may include a single data rate element and the second module 404 may include a double data rate element but the embodiments of the invention are applicable to other systems working on asynchronous clocks with a buffer for transferring transaction data in use of the device from said first module to said second module synchronously between the two clock domains. The first module 404 may be included in a first clock domain CLK1 and the second module in a second clock domain CLK2, the first and second clock domains being mutually asynchronous. The step 510 of de-asserting the inhibit signal may be synchronized with the second clock domain CLK2. The step 510 of de-asserting the inhibit signal may be synchronized relative to the second clock domain CLK2 before being applied in the second module 404.

Figure 6:
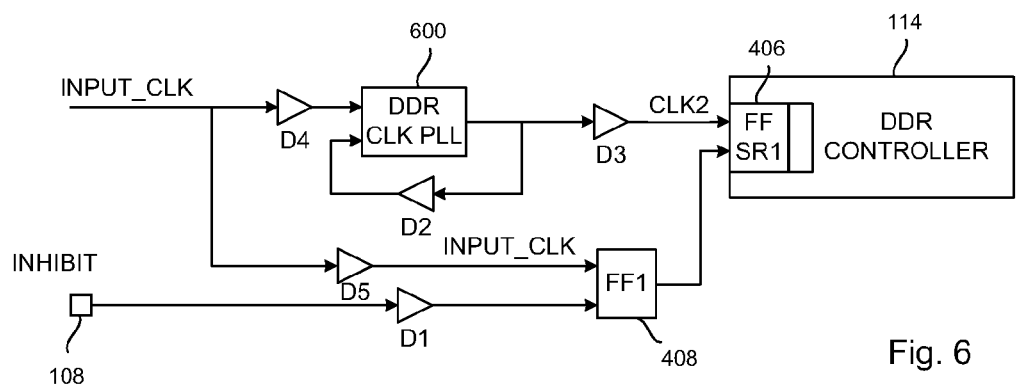
FIG. 6 is a schematic diagram of part of the semiconductor device of FIG. 4 including clock signal generators and showing relative signal delays.

It will be appreciated that the time delays within a semiconductor device such as 400 are adjusted appropriately to achieve suitable synchronism. FIG. 6 illustrates relationships between various delays in part of the semiconductor device 400. The inhibit signal applied to the inhibit input 108 is applied to the flip-flop element 408 over a path whose inherent path delay is D1. A clock generator 600, such as a phaselocked-loop ('PLL') generator, receives an input clock signal INPUT_CLK and generates a coherent clock signal in the second clock domain CLK2. The clock generator 600 includes a feedback path from its output to its input with an inherent path delay of D2. The clock generator 600 provides the clock signal to the synchronization element 406 with an inherent path delay of D3. The input clock signal INPUT_CLK is provided to the clock generator 600 with a delay of D4 and to the flip-flop element 408 with a delay of D5.

In this example, static timing constraints are observed as follows. The inhibit signal applied to the inhibit input 108 is constrained with respect to the input clock signal INPUT_CLK and the corresponding path is timed as a normal input/output timing path. For the path between the flip-flop element 408, which latches the inhibit signal from the inhibit input 108, and the synchronization element 406, which captures the assertion and de-assertion of the inhibit signal in the second clock domain CLK2, the set-up and hold checks are defined by taking D5 as the latency for the launch flip-flop element 408, and D4+D3−D2 as the latency for the capture synchronization element 406.

Figure 7:
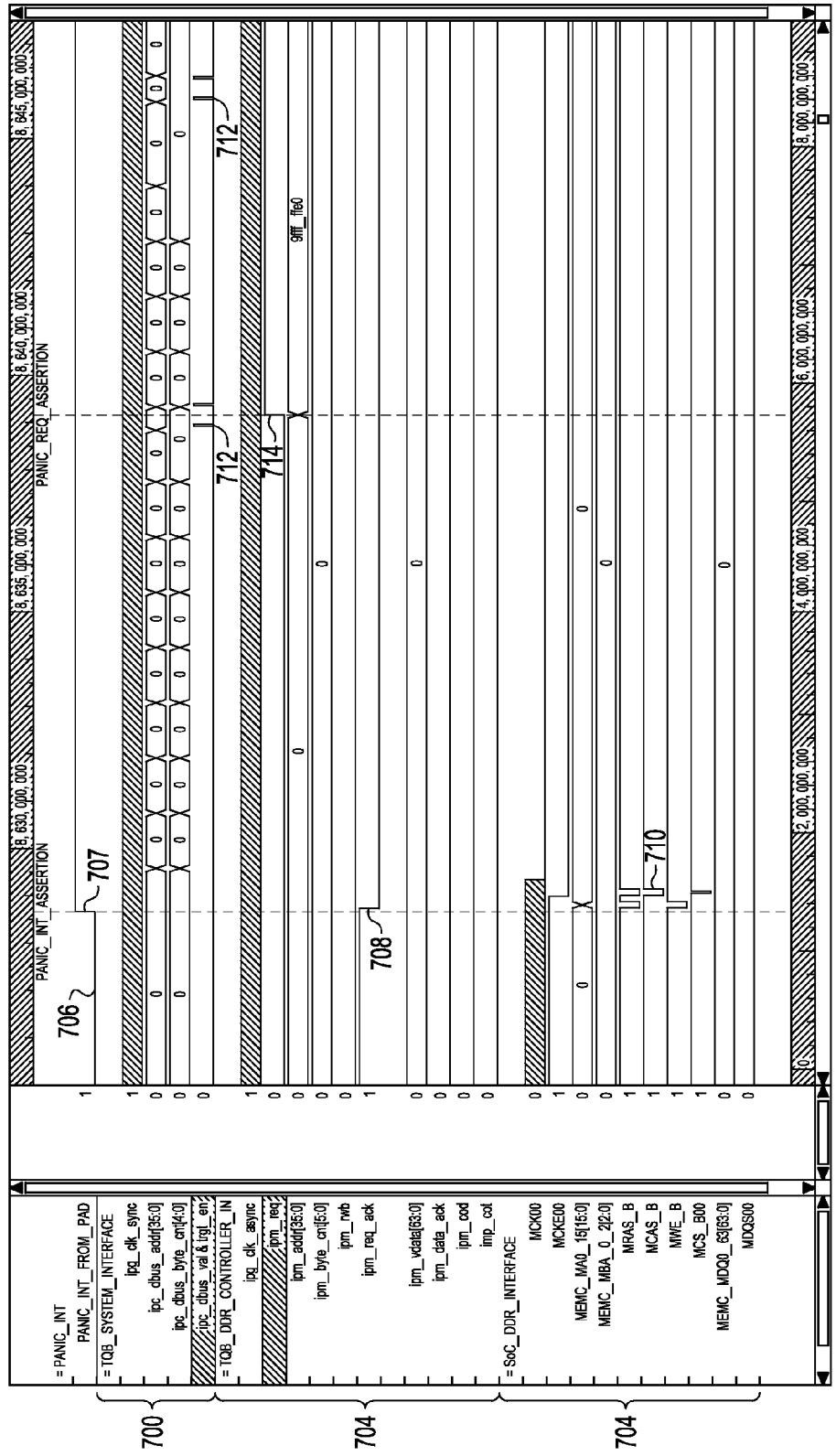
FIGS. 7 and 8 are graphs of signals appearing during the method of testing of FIG. 5 applied to the device of FIG. 4.
Figure 8:
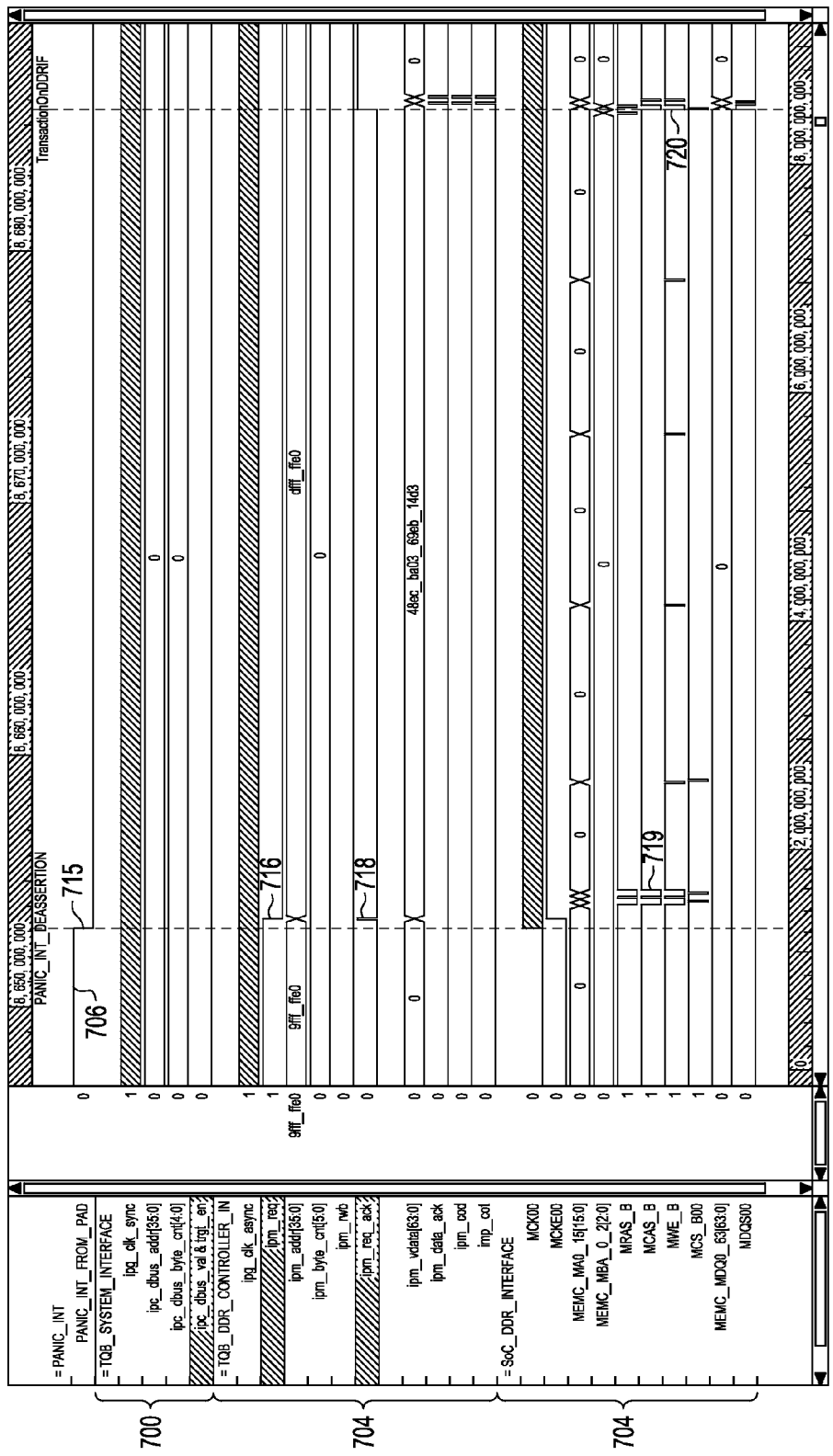

FIGS. 7 and 8 show signals appearing in operation of the semiconductor device 400 as shown in FIGS. 4 and 6 during testing using the method 500. FIG. 7 shows signals appearing during assertion of the inhibit signal and FIG. 8 shows signals appearing during de-assertion of the inhibit signal. FIGS. 7 and 8 show signals at three different interfaces:

1. The interface 700 between the target queue buffer 106 and the system, including the SRAM 116, the DMA 118 and the test port 120, through the data bus 122 in the CLK1 clock domain with a 533 MHz data rate,
2. The interface 702 between the target queue buffer 106 and the DDR controller 114 in the CLK2 clock domain with a 800 MHz data rate, and
3. The data output interface 704 of the DDR controller 114 in the CLK2 clock domain with a 800 MHz data rate.

Referring first to FIG. 7, the test inhibit signal 706 from the ATE is asserted during the test process 500 at the step 504 as shown at 707, in this example as a panic interrupt signal. The DDR controller 114 responds to the test inhibit signal 706 after synchronization to the input clock signal INPUT_CLK by immediately blocking the acknowledgement signals IPM_REQ_ACK, in this example by setting their value to de-asserted as shown at 708. The absence of acknowledgement signals IPM_REQ_ACK inhibits the buffer 106 from transferring read/write transactions to the DDR controller 114 and the data output 110. In addition, in this example the DDR controller 114 places the double data rate memory in self-refresh mode by asserting a self-refresh command 710.

At the step 506, the ATE provides write and/or read test transaction data 712 to the first module 402 and through the DMA 118 and the transaction data bus 122 to the buffer 106 while the inhibit signal 706 is asserted. In this example, four test transactions 712 are shown. The test transaction data 712 appear at the interface 700 between the target queue buffer 106 and the system. The target queue buffer 106 initiates a transaction on the interface 702 by asserting transaction control signals IPM_REQ corresponding to the first of the four test transactions 712 received by the buffer 106 from the interface 700 at 714, and waits for an acknowledgement signal IPM_REQ_ACK from the DDR controller 114, which the buffer 106 does not receive while the test inhibit signal 706 is asserted. The four test transactions 712 are queued in the target queue buffer 106 at the step 508.

Referring to FIG. 8, the test inhibit signal 706 is de-asserted as shown at 715 during the test process 500 at the step 510 after a delay sufficient to ensure stabilization of the contents of the buffer 106. The step 510 of de-asserting the inhibit signal is synchronized with the input clock signal INPUT_CLK before being synchronously sampled by the synchronization element 406 in the second clock domain CLK2. The DDR controller 114 responds to the de-assertion of the synchronized test inhibit signal 706 by unblocking the acknowledgement signals IPM_REQ_ACK at 718, in this example by releasing their value. In this example the DDR controller 114 also exits the self-refresh mode of the DDR memory and issues commands 719 to initialize the DDR memory in preparation for transactions.

At the step 512, the DDR controller 114 receives four test transaction address/control signals from the interface 702 at 716, after sending acknowledgement signals IPM_REQ_ACK to the target queue buffer 106 at 718. Once the DDR controller 114 is ready to initiate data transactions to external DDR memory after exiting self-refresh mode, it transfers the four test transactions to the transaction data output 110 at 720.

Figure 9:
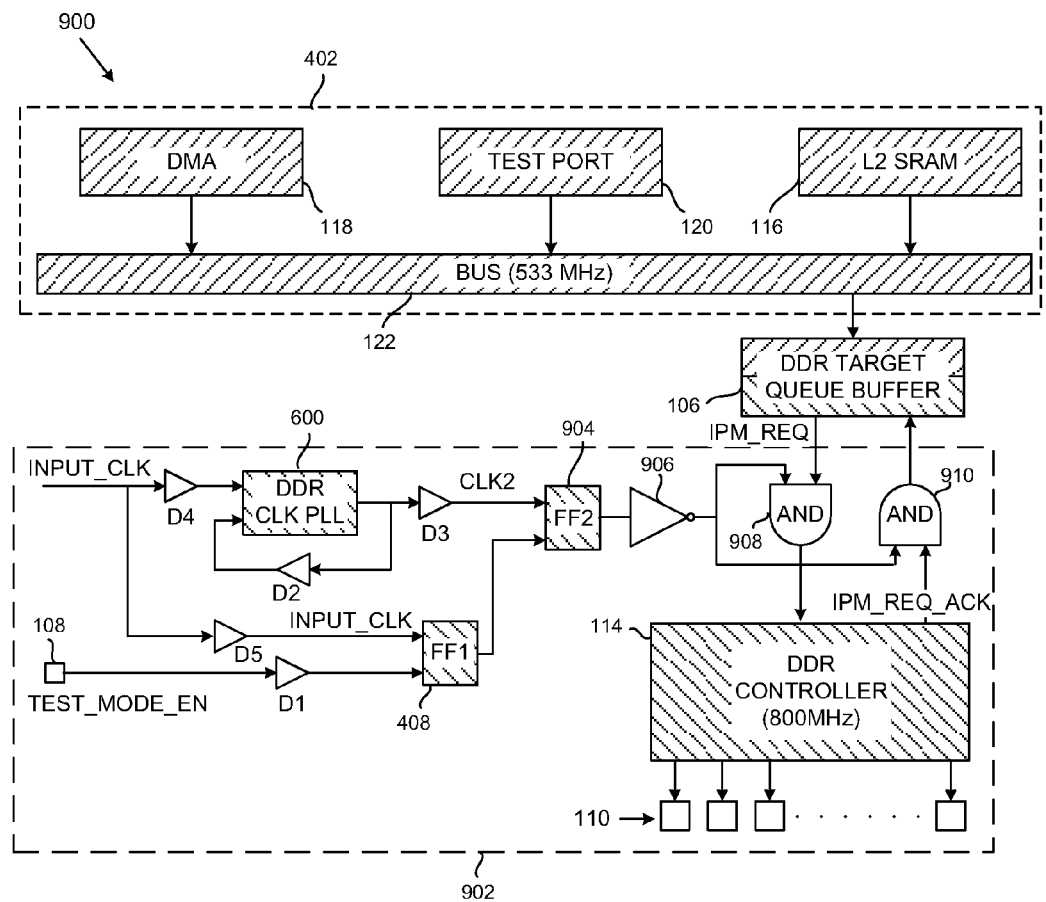
FIG. 9 is a block schematic diagram of a semiconductor device including asynchronous modules in accordance with another embodiment of the invention, given by way of example.

FIG. 9 shows a semiconductor device 900 in accordance with another embodiment of the invention, given by way of example. The device 900 includes a first module 402 and a second module 902 included respectively in a first clock domain CLK1 and in a second clock domain CLK2 which are mutually asynchronous. Like the semiconductor device 400, the semiconductor device 900 includes a target queue buffer ('TQB') 106 for transferring transaction data in use of the device from the first module 402 to the second module 902 synchronously with an operational data transfer rate of the second module 902, and also includes an inhibit input 108 for receiving an inhibit signal. The second module 902 includes a transaction data output 110.

In the example of semiconductor device 900 shown in FIG. 9, the second module 902 may be always operative in normal use of the device to transfer the transaction data for read/write operations from the target queue buffer 106 to the data output 110, the inhibit input 108 not necessarily being used in normal operation. However, during test of the device a test mode signal TEST_MODE_EN provided by the ATE may be applied to the inhibit input 108 as an inhibit signal, and the second module 902 is then operative to receive the transaction data for read/write operations from the target queue buffer 106 and to transfer the received data to the data output 110 when the inhibit signal is de-asserted and not to receive the transaction data nor transfer transaction data to the data output when the inhibit signal is asserted.

In the example of semiconductor device 900 shown in FIG. 9, the first module 402 is a single data rate ('SDR') module, operating in the first clock domain CLK1 at a data rate of 533 MHz, and the second module 902 is a double data rate ('DDR') module, operating at a data rate of 800 MHz, in the second clock domain CLK2. The first module 402 includes a memory element 116, in this case a static random access, level 2 memory, a direct memory access element 118, a test port 120 operating in the first clock domain, and a data bus 122 operating at the data rate of the first module 402, 533 MHz and supplying data from the elements 116, 118 and 120 to the target queue buffer 106.

The second module 902 also includes synchronization elements operable at least during test of the device for synchronizing with the second clock domain CLK2 de-assertion of the inhibit signal at the second module 902. Thus the device 900 may include a first flip-flop element 408, which receives the inhibit signal applied to the inhibit input 108 over a path whose inherent path delay is D1. A clock generator 600, such as a phase-locked-loop ('PLL') generator, includes a feedback path from its output to its input with an inherent path delay of D2. The clock generator 600 provides a clock signal in the second clock domain CLK2 to a flip-flop element 904 in the second module 902 with an inherent path delay of D3. An input clock signal INPUT_CLK for the clock generator of the second clock domain CLK2 is applied to the clock generator 600 with a delay of D4 and to the first bistable element 408 with a delay of D5.

In this example, static timing constraints ('STA') are observed as described with reference to FIG. 6. However, instead of applying the output of the first flip-flop element 408 to a synchronization element 406 in the DDR controller 114, it is applied to a data input of the second flip-flop element 904, a second, clock input of which receives the clock signal in the second clock domain CLK2 from the clock generator 600. The output of the second flip-flop element 904 is applied through an inverter 906 to one input of each of a pair of AND gates 908 and 910. The gate 908 receives transaction control signals IPM_REQ from the target queue buffer 106 and its output, applied to the DDR controller 114, is asserted when both its inputs are asserted and not otherwise. The gate 910 receives acknowledgement signals IPM_REQ_ACK from the DDR controller 114 and its output, applied to the target queue buffer 106, is asserted when both its inputs are asserted and not otherwise.

In operation, the second module 902 receives the transaction control signals IPM_REQ from the buffer 106 when the inhibit signal is de-asserted but transfer of the transaction data from the buffer 106 is blocked when the inhibit signal is asserted during test. The second module 902 issues acknowledgements IPM_REQ_ACK of the transaction data to the buffer 106 when the inhibit signal is de-asserted but transfer of the acknowledgements to the buffer 106 is blocked when the inhibit signal is asserted. The buffer 106 receives further transaction data from the first module and transfers the further transaction data to the second module in response to reception of the acknowledgements.

Figure 10:
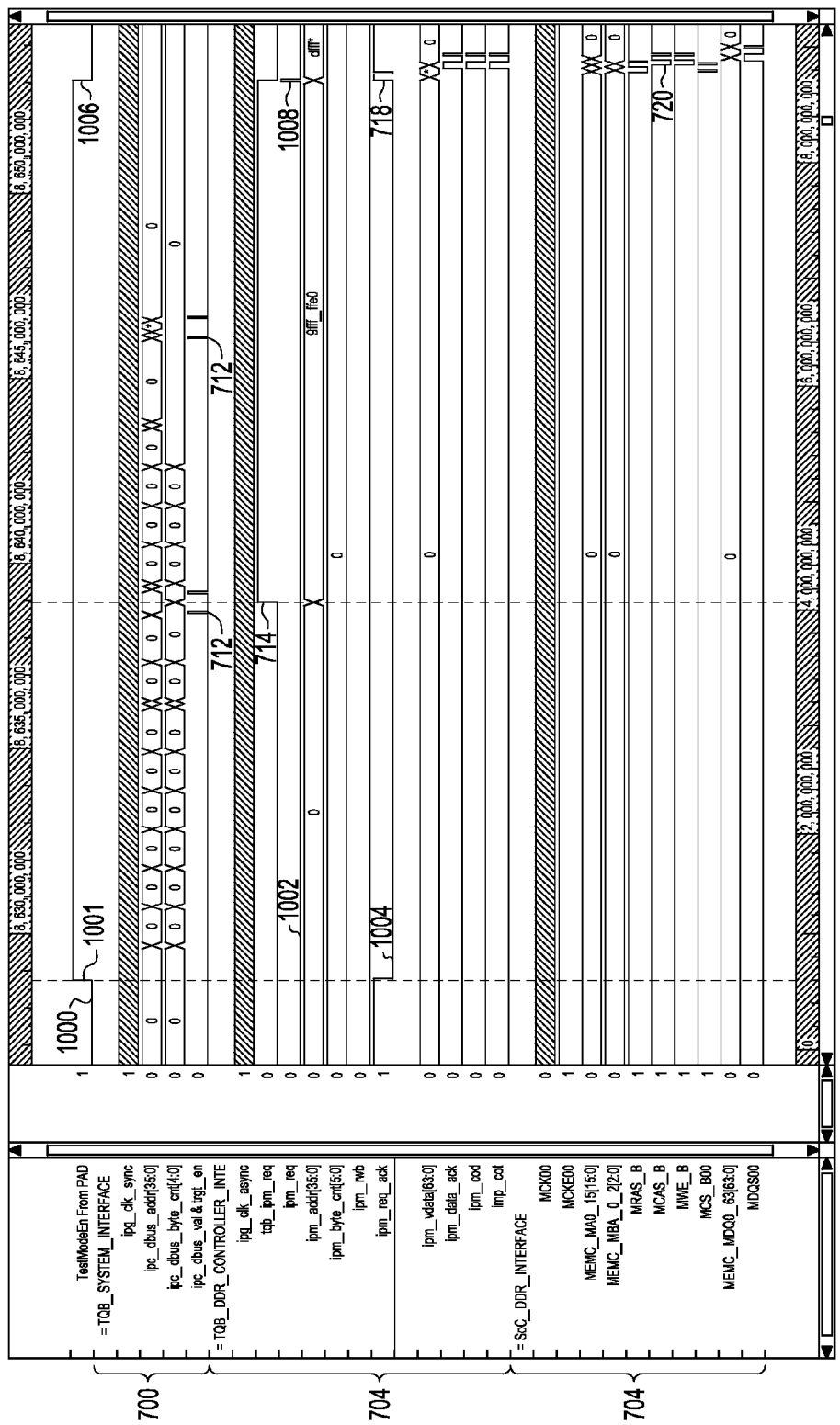
FIG. 10 is a graph of signals appearing during the method of testing of FIG. 5 applied to the semiconductor device of FIG. 9.

FIG. 10 shows signals appearing in operation of the semiconductor device 900 as shown in FIG. 9 during testing using the method 500. FIG. 10 shows signals at the three interfaces 700, 702 and 704.

The test inhibit signal 1000 is asserted during the test process 500 at the step 504 by the ATE as shown at 1001, in this example as a test mode enable signal. The gates 908 and 910 block both the test transaction control signals IPM_REQ and the acknowledgement signals IPM_REQ_ACK, in this example by the bistable elements 408 and 904 and the inverter 906 de-asserting an input of each of the gates 908 and 910 so that their outputs are set to de-asserted, as shown at 1002 and 1004.

At the step 506, the ATE provides write and/or read test transaction data 712 to the first module 402 through the DMA 118 and the transaction data bus 122 to the buffer 106 while the inhibit signal 1000 is asserted. In this example, four test transactions 712 are shown. The test transactions 712 appear at the interface 700 between the target queue buffer 106 and the system. The target queue buffer 106 provides a transaction control signal IPM_REQ corresponding to the first of the four test transactions 712 for the DDR controller 114 on the interface 702 at 714 but it is blocked by the gate 908, whose output applied to the DDR controller 114 remains de-asserted. The target queue buffer 106 waits for an acknowledgement signal IPM_REQ_ACK from the DDR controller 114, which the buffer 106 does not receive while the test inhibit signal 1000 is asserted and the output of the gate 910 is de-asserted. The four test transactions 712 are queued in the target queue buffer 106 at the step 508.

The test inhibit signal 1000 is de-asserted during the test process 500 at the step 510 as shown at 1006 after a delay sufficient to ensure stabilization of the content of the target queue buffer 106. The step 510 of de-asserting the inhibit signal is synchronized with the input clock signal INPUT_CLK by the flip-flop element 408 before being sampled by the flip-flop element 904 working in the second clock domain CLK2. The gates 908 and 910 respond to the de-assertion of the synchronized test inhibit signal at 1006 by unblocking the transaction control signals IPM_REQ corresponding to the four test transactions 712 at 1008 and the corresponding acknowledgement signals IPM_REQ_ACK at 718.

At the step 512, the DDR controller 114 receives the four test transactions on the interface 702, and sends acknowledgement signals IPM_REQ_ACK and IPM_DATA_ACK to the target queue buffer 106. The DDR controller 114 then transfers the four test transactions to the transaction data output 110 at 720.

In this example the DDR controller 114 does not need to initiate a self-refresh mode of the DDR memory. The process illustrated in FIGS. 9 and 10 is applicable to a wide variety of protocols between the target queue buffer 106 and the DDR controller 114.

The invention may be partially implemented in a computer program for running on a computer system, at least including code portions for performing steps of a method according to the invention when run on a programmable apparatus, such as a computer system or enabling a programmable apparatus to perform functions of a device or system according to the invention.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method of testing a semiconductor device that includes a first module and a second module that are mutually asynchronous, a buffer for storing transaction data for read/write operations from said first module and transferring the stored transaction data to said second module synchronously with an operational data transfer rate of said second module, and an inhibit input for receiving an inhibit signal, said second module including a transaction data output and being operative both in normal use of the device and during test of the device to receive said transaction data from said buffer and to transfer the received transaction data to said transaction data output when said inhibit signal is de-asserted and not to receive transaction data nor transfer transaction data to said transaction data output when said inhibit signal is asserted, the method of testing comprising repeatedly:
asserting said inhibit signal from an automatic test equipment to inhibit transfer of transaction data to said transaction data output;
providing test transaction data from said automatic test equipment to said first module and storing said test transaction data in said buffer while said inhibit signal is asserted;
de-asserting said inhibit signal so that said second module transfers test transaction data received from said buffer to said transaction data output synchronously at said operational data transfer rate of said second module; and
capturing the test transaction data deterministically from said transaction data output of said second module on said automatic test equipment.

2. The method of claim 1, wherein assertion of said inhibit signal inhibits transfer of transaction data by said second module to said transaction data output.

3. The method of claim 1, wherein assertion of said inhibit signal causes said second module to function in a self-refresh mode.

4. The method of claim 1, wherein said second module issues acknowledgements of said transaction data to said buffer when said inhibit signal is de-asserted but not when said inhibit signal is asserted, and said buffer transfers said stored transaction data to said second module only in response to said acknowledgements.

5. The method of claim 1, wherein said second module receives said transaction data from said buffer when said inhibit signal is de-asserted but transfer of said transaction data from said buffer is blocked when said inhibit signal is asserted.

6. The method of claim 5, wherein said second module issues acknowledgements of said transaction data to said buffer when said inhibit signal is de-asserted but transfer of said acknowledgements to said buffer is blocked when said inhibit signal is asserted, and said buffer transfers said stored transaction data to said second module only in response to receipt of said acknowledgements.

7. The method of claim 1, wherein said first module includes a single data rate element and said second module includes a double data rate element.

8. The method of claim 1, wherein said first module is included in a first clock domain and said second module is included in a second clock domain, said first and second clock domains being mutually asynchronous.

9. The method of claim 8, wherein said de-asserting said inhibit signal is synchronized with said second clock domain.

10. The method of claim 9, wherein said de-asserting said inhibit signal is synchronized with a clock signal that has a frequency lower than, but is synchronized relative to, said second clock domain during testing before being applied in said second module.

11. A semiconductor device, comprising:
a first module and a second module included respectively in a first clock domain and in a second clock domain which are mutually asynchronous;
a buffer for storing transaction data for read/write operations from said first module and transferring the stored transaction data to said second module synchronously at an operational transaction data transfer rate of said second module; and
an inhibit input for receiving an inhibit signal;
wherein said second module includes a transaction data output and being operative both in normal use of the device and during test of the device to receive said transaction data from said buffer and to transfer the received transaction data to said transaction data output when said inhibit signal is de-asserted and not to transfer said transaction data to said transaction data output when said inhibit signal is asserted, and
said second module includes a synchronization element operable at least during test of the device for synchronizing with said second clock domain de-assertion of said inhibit signal at said second module.

12. The semiconductor device of claim 11, wherein a further synchronization element is operative at least during test of said device for synchronizing de-assertion of said inhibit signal at said second module relative to said second clock domain before being applied in said second module.

13. The semiconductor device of claim 11 wherein said synchronization element comprises a first bistable element having first and second inputs connected respectively to receive said inhibit signal from said inhibit input and a first clock signal which has a frequency lower than, but is synchronized relative to, said second clock domain, said first bistable element asserting a first synchronized inhibit signal at the first active edge of said first clock signal after said inhibit signal from said inhibit input is asserted, and a second bistable element having first and second inputs connected respectively to receive said first synchronized inhibit signal and a second clock signal from said second clock domain, said second bistable element asserting a second synchronized inhibit signal at said second module at the first active edge of said second clock signal after said first synchronized inhibit signal is asserted and de-asserting said second synchronized inhibit signal at said second module at the first active edge of said second clock signal after said first synchronized inhibit signal is de-asserted.

14. The semiconductor device of claim 11, wherein assertion of said inhibit signal inhibits transfer of transaction data by said second module to said transaction data output.

15. The semiconductor device of claim 11, wherein assertion of said inhibit signal causes said second module to function in a self-refresh mode.

16. The semiconductor device of claim 11, wherein said second module issues acknowledgements of said transaction data to said buffer when said inhibit signal is de-asserted but not when said inhibit signal is asserted, and said buffer transfers said stored transaction data to said second module only in response to said acknowledgements.

17. The semiconductor device of claim 11, further comprising a control data gate that transfers control data from said buffer to said second module when said inhibit signal is de-asserted but transfer of said control data from said buffer is blocked when said inhibit signal is asserted.

18. The semiconductor device of claim 17, further comprising an acknowledgement gate that transfers acknowledgements of said transaction data from said second module to said buffer when said inhibit signal is de-asserted but blocks transfer of said acknowledgements to said buffer when said inhibit signal is asserted, and said buffer transfers said stored transaction data to said second module only in response to said acknowledgements.

19. The semiconductor device of claim 11, wherein said first module includes a memory element, a direct memory access element and a test port operating in said first clock domain.

20. The semiconductor device of claim 11, wherein said first module includes a single data rate element and said second module includes a double data rate element.

* * * * *